United States Patent
Li et al.

(10) Patent No.: US 11,296,801 B2
(45) Date of Patent: Apr. 5, 2022

(54) METHOD FOR CALIBRATING CRYSTAL FREQUENCY OFFSET THROUGH RADIO FREQUENCY SIGNAL

(71) Applicant: Amlogic (Shanghai) Co., Ltd., Shanghai (CN)

(72) Inventors: Shuangqing Li, Shanghai (CN); Kun Zhang, Shanghai (CN); Jie Feng, Shanghai (CN)

(73) Assignee: Amlogic (Shanghai) Co., Ltd., Shanghai (CN)

( * ) Notice: Subject to any disclaimer, the term of this patent is extended or adjusted under 35 U.S.C. 154(b) by 141 days.

(21) Appl. No.: 16/342,158

(22) PCT Filed: Oct. 31, 2018

(86) PCT No.: PCT/CN2018/113147
§ 371 (c)(1),
(2) Date: Apr. 15, 2019

(87) PCT Pub. No.: WO2019/134429
PCT Pub. Date: Jul. 11, 2019

(65) Prior Publication Data
US 2021/0336708 A1    Oct. 28, 2021

(30) Foreign Application Priority Data
Jan. 4, 2018 (CN) .......................... 20181000852.7

(51) Int. Cl.
*H04B 17/00* (2015.01)
*H04B 17/11* (2015.01)
(Continued)

(52) U.S. Cl.
CPC ......... *H04B 17/11* (2015.01); *G01R 29/0878* (2013.01); *H04B 17/21* (2015.01); *H04W 84/12* (2013.01)

(58) Field of Classification Search
CPC ........ H04B 17/11; H04B 17/15; H04B 17/21; H04B 17/29; H04W 84/12; H04W 24/00
See application file for complete search history.

(56) References Cited

U.S. PATENT DOCUMENTS

| | | | | |
|---|---|---|---|---|
| 2008/0285467 A1* | 11/2008 | Olgaard | ............. | H04B 17/0085 370/242 |
| 2014/0146866 A1* | 5/2014 | Strachan | ............... | G01R 31/086 375/226 |
| 2016/0202299 A1* | 7/2016 | Zaostrovnykh | ........ | G01R 27/28 702/108 |

FOREIGN PATENT DOCUMENTS

| CN | 101150330 A | 3/2008 |
|---|---|---|
| CN | 101267230 A | 9/2008 |

(Continued)

*Primary Examiner* — Tuan Pham
(74) *Attorney, Agent, or Firm* — Levenfeld Pearlstein, LLC

(57) ABSTRACT

A method for calibrating crystal frequency offset through a radio frequency signal includes, in Step S1, a radio frequency port of a device is connected to one end of a radio frequency cable through a copper pipe connector and the other end of the radio frequency cable is connected to a Wireless Local Area Network (WLAN) tester which is connected with a control terminal. In Step S2, a user controls the WLAN tester to test the radio frequency signal of the device through the control terminal to obtain a test result, and determines whether a deviation of the radio frequency signal is qualified. If it is qualified, the user exits the test, otherwise the user regulates the crystal circuit of the device under test, and returns to Step S2. The method may not be affected by a probe, thus the measurement may be more accurate.

7 Claims, 1 Drawing Sheet

(51) Int. Cl.
*H04B 17/21* (2015.01)
*G01R 29/08* (2006.01)
*H04W 84/12* (2009.01)

(56) References Cited

FOREIGN PATENT DOCUMENTS

| CN | 101399577 A | 4/2009 |
| CN | 103427916 A | 12/2013 |
| CN | 104683040 A | 6/2015 |

* cited by examiner

METHOD FOR CALIBRATING CRYSTAL FREQUENCY OFFSET THROUGH RADIO FREQUENCY SIGNAL

CROSS-REFERENCE TO RELATED APPLICATION DATA

This application is a US National Stage application of PCT/CN2018/113147, filed Oct. 31, 2018, which PCT application claims the benefit of and priority to Chinese Patent Application No. 201810008527.7, filed Jan. 4, 2018, the disclosures of which are incorporated herein in their entireties.

BACKGROUND OF THE INVENTION

1. Field of the Invention

The invention relates to the field of communication technologies, and more particularly, to a method for calibrating crystal frequency offset through a radio frequency signal.

2. Description of the Related Art

At present, as a frequency of a high-speed signal becomes increasingly higher, the requirement on the crystal frequency offset becomes more and more strict. When the load capacitance is incompatible with the crystal, an excessive large crystal frequency offset may occur and thus the system may become instable, and performance of Radio Frequency (RF) may be affected to a larger extent. A problem is stated as follows: due to the fact that the clock of the crystal and the external load capacitance are designed based on empirical values, it is difficult to meet the requirement on high precision clock. In addition, since the clock of the crystal and the non-essential resistance are designed based on empirical values, it is also difficult to meet the requirement on high precision clock.

Two technical solutions are put forward by those skilled in the art to solve the above-mentioned problem.

1. Directly measure the clock frequency on the transistor pin by using an oscilloscope, however, some problems can be found in the solution: the measurement is not accurate, the oscilloscope probe will affect the load capacitance, and thus, the offset is large.

2. Directly measure the clock frequency on the transistor pin by using a frequency meter, however, the load capacitance will be affected as well, leading to an inaccurate test result.

SUMMARY OF THE INVENTION

With respect to the foregoing problems in the prior art, the present invention provides a method for calibrating crystal frequency deviation through a radio frequency signal.

The technical solutions are as follows:

A method for calibrating crystal frequency offset through a radio frequency signal which is applied to a crystal circuit, comprising:

Step S1, a radio frequency port of a device under test being connected to one end of a radio frequency cable through a copper pipe connector, the other end of the radio frequency cable being connected to a Wireless Local Area Network (WLAN) tester; and Step S2, a user controlling the Wireless Local Area Network tester to test the radio frequency signal of the device under test through the control terminal so as to obtain a test result, and the user determining whether a deviation of the radio frequency signal is qualified based on the test result;

if the result shows that the deviation of the radio frequency signal is qualified, the user exits the test;

and if the result shows that the deviation of the radio frequency signal is unqualified, the user regulates the crystal circuit of the device under test, and then turns to Step S2.

Preferably, the Wireless Local Area Network tester comprises a test module and a control terminal module.

Preferably, the control terminal module is a PC port.

Preferably, the test module is connected to the control terminal module via a wired connection.

Preferably, in Step S2, the user views the test result through a display device of the control terminal module.

Preferably, in Step S2, when the user determines that a deviation of the radio frequency signal is unqualified based on the test result, the user regulates a capacitance value of a load capacitance of the crystal circuit.

Preferably, the radio frequency port of the device under test is an ANT.

The technical solution set forth in the invention has the advantages that the method may not be affected by a probe, thus the measurement may be more accurate.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
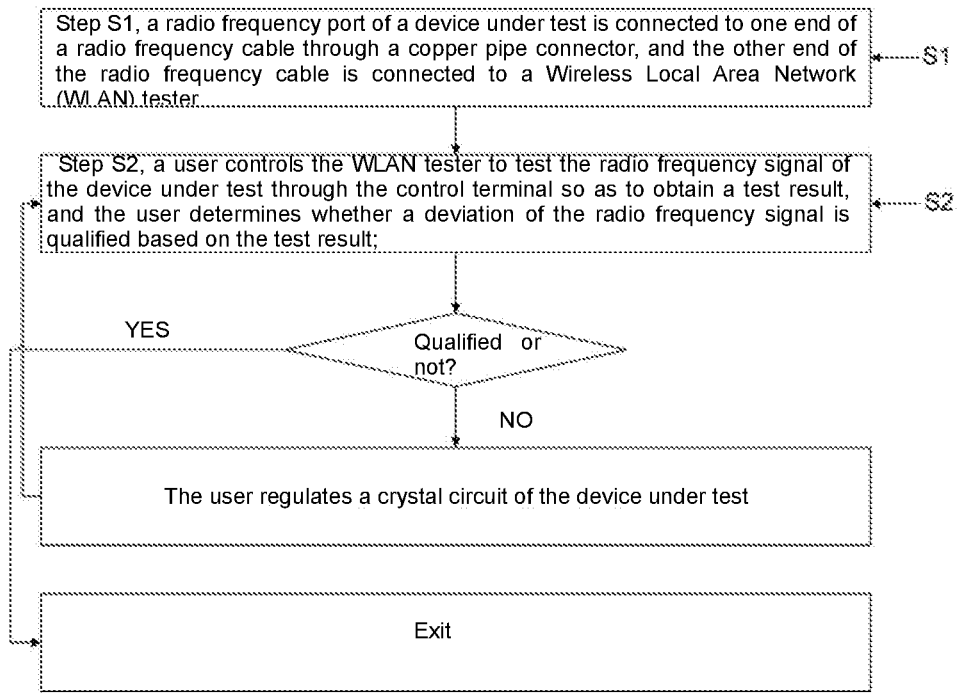
FIG. 1 is a flowchart of a method for calibrating crystal frequency offset through a radio frequency signal according to a preferred embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "plurality" means a number greater than one.

Hereinafter, certain exemplary embodiments according to the present disclosure will be described with reference to the accompanying drawings.

Figure 2:
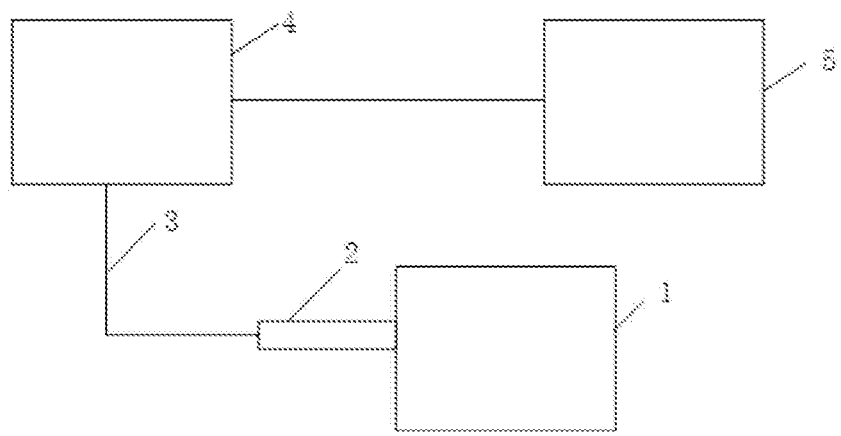
FIG. 2 is a structure diagram of a method for calibrating crystal frequency offset through a radio frequency signal according to a preferred embodiment of the present invention.

As shown in FIGS. 1 and 2, a method for calibrating crystal frequency offset through a radio frequency signal comprises:

Step S1, a radio frequency port of a device under test 1 is connected to one end of a radio frequency cable 3 through a copper pipe connector 2, the other end of the radio frequency cable 3 is connected to a test module 4 of a Wireless Local Area Network tester, IQFlex (the Wireless Local Area Network tester comprises the test module 4 and a control terminal module 5, when the control terminal module 5 is omitted, the test module 4 may be the IQFlex itself which is commonly used by those skilled in the art), and the test module 4 is connected to the control terminal module; and Step S2, a user controls the test module 4 to test the radio frequency signal of the device under test 1 through the control terminal module 5 so as to obtain a test result, and the user determines whether a deviation of the radio frequency signal is qualified based on the test result;

if the result shows that the deviation of the radio frequency signal is qualified, the user exits the test;

and if the result shows that the deviation of the radio frequency signal is unqualified, the user regulates the crystal circuit of the device under test 1, and then turns to Step S2.

In a preferred embodiment, the radio frequency port of the device under test 1 is an ANT.

In a preferred embodiment, the test module 4 is connected to the control terminal module 5 via a wired connection.

In a preferred embodiment, the control terminal module 5 is a PC port.

In a preferred embodiment, in Step S2, the user views the test result through a display device of the control terminal module 5.

In a preferred embodiment, when the user determines that a deviation of the radio frequency signal is unqualified based on the test result, the user regulates a capacitance value of a load capacitance of the crystal circuit.

In this embodiment, the RF is tested by using IQFlex so as to regulate a matching capacitance of the crystal, and to calibrate a clock of WIFI.

The test method is described in detail as follows: firstly, a radio frequency (RF) port of a device under test (DUT) is connected to a radio frequency (RF) cable through the copper pipe connector 2; the device under test is connected to the test device IQFlex though the RF cable; then IQFlex is connected to the PC for conducting the test. By conducting a RF index test, the deviation of the frequency offset of a crystal oscillator clock may be displayed on a PC interface. In this case, the load capacitance is regulated, the frequency offset is regulated to a smaller value, and clock offset is reduced accordingly. The method would not be affected by a probe, thus the measurement is more accurate.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A method for calibrating crystal frequency offset through a radio frequency signal which is applied to a crystal circuit, comprising:
   connecting, a step 1, a radio frequency port of a device under testing to one end of a radio frequency cable through a copper pipe connector, an opposite of the radio frequency cable being connected to a wireless local area network (WLAN) tester;
   controlling the WLAN tester to test a radio frequency signal of the device under testing through a control terminal to obtain a test result, a user determining whether a deviation of the radio frequency signal is qualified based on the test result; and
   controlling, at step 2, by a user, the WLAN tester to test the radio frequency signal of the device under testing through the control terminal to obtain a test result, the user determining whether a deviation of the radio frequency signal is qualified based on the test result;
   wherein if the test result shows that the deviation of the radio frequency signal is qualified, the user exits the test, and
   wherein if the test result shows that the deviation of the radio frequency signal is unqualified, the user regulates the crystal circuit of the device under testing, and returns to step 2.

2. The method for calibrating crystal frequency offset through a radio frequency signal of claim 1, wherein the WLAN tester comprises a test module and a control terminal module.

3. The method for calibrating crystal frequency offset through a radio frequency signal of claim 2, wherein the control terminal module is a PC port.

4. The method for calibrating crystal frequency offset through a radio frequency signal of claim 2, wherein the test module is connected to the control terminal module via a wired connection.

5. The method for calibrating crystal frequency offset through a radio frequency signal of claim 2, wherein in step 2, the user views the test result through a display device of the control terminal module.

6. The method for calibrating crystal frequency offset through a radio frequency signal of claim 1, wherein in step 2, when the user determines that a deviation of the radio frequency signal is unqualified based on the test result, the user regulates a capacitance value of a load capacitance of the crystal circuit.

7. The method for calibrating crystal frequency offset through a radio frequency signal of claim 1, wherein the radio frequency port of the device under test is an ANT.

* * * * *